United States Patent
Park et al.

(10) Patent No.: US 9,396,765 B2
(45) Date of Patent: Jul. 19, 2016

(54) STACKED SEMICONDUCTOR PACKAGE

(71) Applicant: SK hynix Inc., Icheon-si, Gyeonggi-do (KR)

(72) Inventors: Min Su Park, Icheon-si (KR); Young Jun Ku, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/516,012

(22) Filed: Oct. 16, 2014

(65) Prior Publication Data

US 2016/0012864 A1  Jan. 14, 2016

(30) Foreign Application Priority Data

Jul. 9, 2014 (KR) .................. 10-2014-0086279

(51) Int. Cl.
*H01L 27/088* (2006.01)
*G11C 5/02* (2006.01)
*G11C 29/04* (2006.01)
*G11C 5/04* (2006.01)
*G11C 29/46* (2006.01)

(52) U.S. Cl.
CPC *G11C 5/025* (2013.01); *G11C 5/04* (2013.01); *G11C 29/04* (2013.01); *G11C 29/46* (2013.01)

(58) Field of Classification Search
CPC ...... G11C 7/106; G11C 29/04; G11C 7/1087; G11C 7/22

USPC .......................................................... 257/666
See application file for complete search history.

(56) References Cited

U.S. PATENT DOCUMENTS

| | | | | |
|---|---|---|---|---|
| 8,559,258 | B1* | 10/2013 | Stephens, Jr. .... | G11C 11/40615 365/211 |
| 8,710,655 | B2* | 4/2014 | Kim .................... | H01L 25/0652 257/685 |
| 2010/0027354 | A1* | 2/2010 | Matsui ................ | G11C 7/1078 365/189.05 |
| 2015/0003171 | A1* | 1/2015 | Kim .................... | G11C 29/023 365/189.02 |
| 2015/0248925 | A1* | 9/2015 | Kashyap ............. | G11C 8/18 365/189.02 |

FOREIGN PATENT DOCUMENTS

KR  1020070122077 A  12/2007
KR  1020100033182 A  3/2010

* cited by examiner

*Primary Examiner* — Tuan Nguyen
(74) *Attorney, Agent, or Firm* — William Park & Associates Ltd.

(57) ABSTRACT

A stacked semiconductor package includes a package substrate, an interposer mounted on the package substrate, a plurality of semiconductor chips stacked on the interposer, and a control unit provided in the interposer, that stores in advance data to be written in the plurality of semiconductor chips, and that outputs the data stored in advance according a test mode signal.

11 Claims, 3 Drawing Sheets

STACKED SEMICONDUCTOR PACKAGE

CROSS-REFERENCES TO RELATED APPLICATION

The present application claims priority under 35 U.S.C. §119(a) to Korean application number 10-2014-0086279, filed on Jul. 9, 2014, in the Korean Intellectual Property Office, which is incorporated herein by reference in its entirety as set forth in full.

BACKGROUND

1. Technical Field

Various embodiments relate to a stacked semiconductor package, and more particularly, to a stacked semiconductor package including an interposer.

2. Related Art

A packaging technology for a semiconductor apparatus has been continuously developed with the demand for miniaturization and high capacity, and recently, there have been developed various technologies for a stacked semiconductor package capable of satisfying miniaturization, high capacity, and package efficiency.

The "stacking" in a semiconductor industry indicates a technology of vertically piling at least two semiconductor chips or packages, and in the case of a memory element, it is possible to obtain a product having a memory capacity larger than a memory capacity achievable in a semiconductor integrated process, and to improve the efficiency of use of a package area.

The stacked semiconductor package may include a package substrate, a plurality of semiconductor chips, and an interposer that electrically connects the package substrate to the plurality of semiconductor chips.

In the stacked semiconductor package with such a structure, when input/output pads of the plurality of semiconductor chips are tested using the interposer, loading occurring by the interposer increases and thus delay also increases in the input/output pads, resulting in the deterioration of a test result.

SUMMARY

In an embodiment of the invention, a stacked semiconductor package may include a package substrate, an interposer mounted on the package substrate, and a plurality of semiconductor chips stacked on the interposer. The stacked semiconductor package may also include a control unit provided in the interposer, that stores in advance data to be written in the plurality of semiconductor chips, and outputs the data stored in advance according to a test mode signal.

In an embodiment of the invention, a stacked semiconductor package may include a package substrate, an interposer mounted on the package substrate, and a plurality of semiconductor chips stacked on the interposer. The interposer may include a latch section that stores in advance data to be written and a selection section that is electrically coupled to the latch section and that selects and outputs the data stored in the latch section when a test mode signal is input.

In an embodiment, a stacked semiconductor package may include a package substrate and a plurality of semiconductor chips stacked on an interposer. The interposer may be configured to receive a data enable signal and a data signal and store in advance data to be written, receive the output signal of the data signal, and output the output signal of the data signal based on a selection signal.

DETAILED DESCRIPTION

Hereinafter, a stacked semiconductor package 100 according to the invention will be described in detail with reference to the accompanying drawings through an embodiment.

Figure 1:
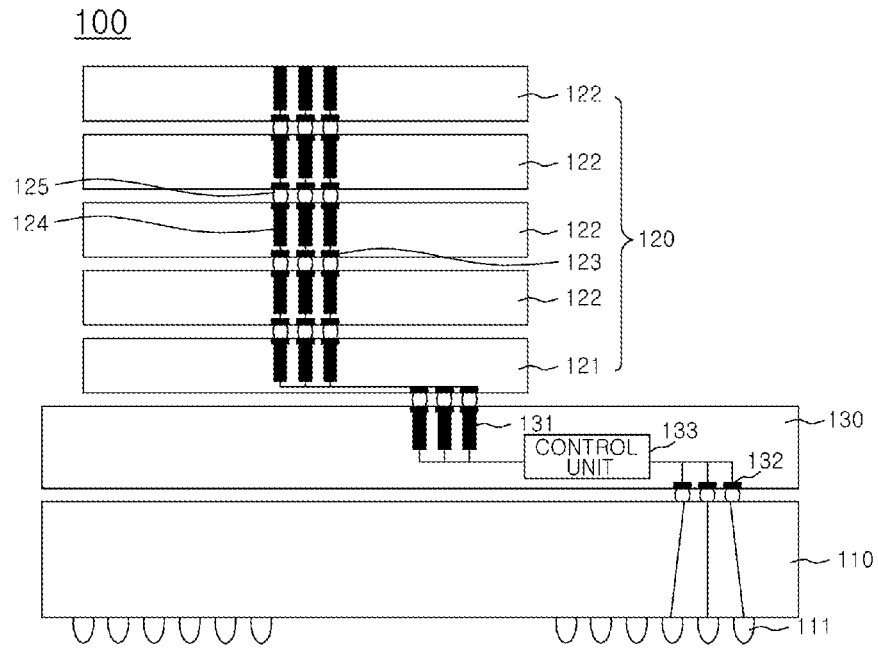
FIG. 1 is a sectional view illustrating the configuration of a stacked semiconductor package according to an embodiment.

Referring to FIG. 1, the stacked semiconductor package 100 may include a package substrate 110, a plurality of semiconductor chips 120, and an interposer 130.

The package substrate 110 is a member on which the plurality of semiconductor chips 120 are mounted. The package substrate 110 may include various types of printed circuit boards (PCBs) having electrical interconnections that electrically couple the mounted semiconductor chips 120 to external other elements or electronic parts. Such a package substrate 110 may be electrically coupled to an external circuit through external conductive terminals 111.

The plurality of semiconductor chips 120 are disposed on the interposer 130 and may include one base chip 121 and a plurality of core chips 122.

The base chip 121, for example, may be disposed on the interposer 130. Such a base chip 121 may include a logic chip that processes general data of the plurality of core chips 122. The base chip 121 is provided with a plurality of input/output pads 123 that receive data to be read or written to the plurality of core chips 122 and the interposer 130. Furthermore, in the base chip 121, data paths may be formed between the plurality of core chips 122 and the interposer 130.

The plurality of core chips 122 may be stacked on the base chip 121. Each core chip 122 may include a memory chip having a plurality of cells capable of storing data. Each core chip 122 may be provided with the plurality of input/output pads 123 that receive data to be read or written under the control of the base chip 121. A reference numeral 124 may indicate a through member for the transfer of signals formed in the semiconductor chips 120. In addition, a reference numeral 125 may indicate a connection terminal for electrically coupling the input/output pads 123 of the stacked semiconductor chips 120 to one another.

The interposer 130 may be disposed between the package substrate 110 and the plurality of semiconductor chips 120. The interposer 130 may also electrically couple the plurality of input/output pads 123 formed in the semiconductor chips 120 to the package substrate 110. Such an interposer 130 may include an input/output unit 131, a substrate connection unit 132, and a control unit 133.

The input/output unit 131 may be electrically coupled to the input/output pads 123 of the base chip 121 of the plurality of semiconductor chips 120. Such an input/output unit 131 may transfer data received from the plurality of semiconductor chips 120 to the control unit 133.

The substrate connection unit 132 may electrically couple the control unit 133 to the package substrate 110. Such a substrate connection unit 132 may transfer data received from the package substrate 110 to the control unit 133.

The control unit 133 may be provided to control delay of tRTW (a minimum time for which write data may be applied after a read operation) in a test. Such a control unit 133 may store in advance data to be written in the test. The control unit 133 may also select and output the data stored in advance according to the tRTW when a test mode signal is applied.

Figure 2:
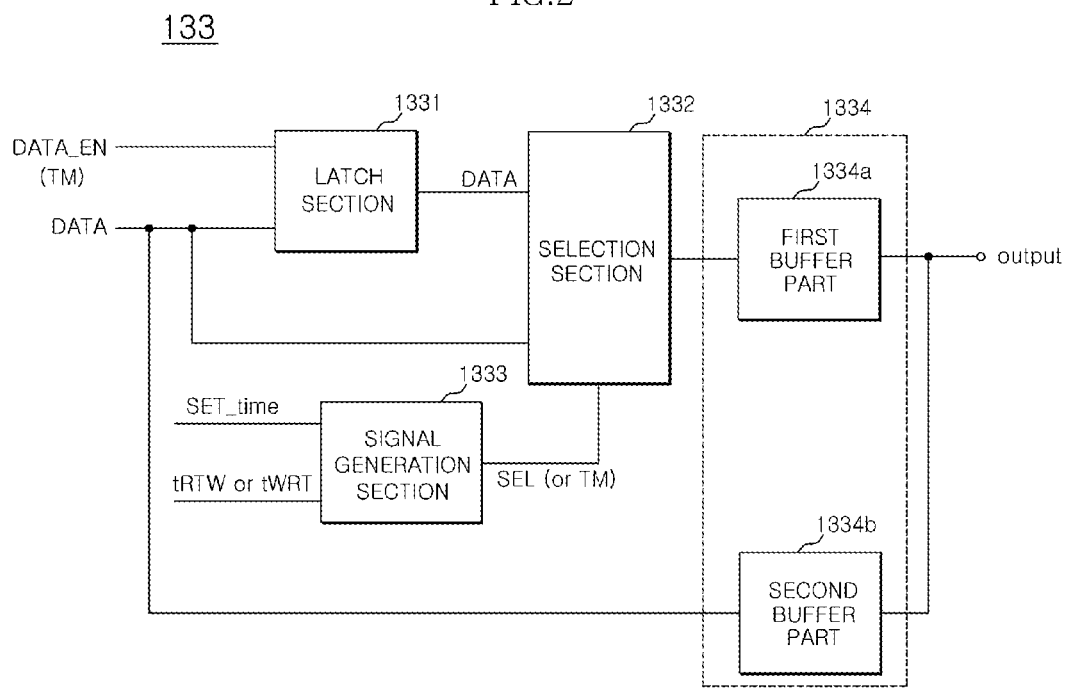
FIG. 2 is a diagram illustrating the configuration of a control unit provided in an interposer according to an embodiment.

Referring to FIG. 2, the control unit 133 may include a latch section 1331, a selection section 1332, a signal generation section 1333, and a buffer section 1334.

The latch section 1331 may receive a data enable signal DATA_EN and a data signal DATA. The latch section 1331 may also store in advance data to be written before a test is started. The data enable signal DATA_EN may include test mode information. The data signal DATA may include a signal transferred through the substrate connection unit 132 electrically coupled to the package substrate 110, or through the input/output unit 131 electrically coupled to the plurality of semiconductor chips 120. Accordingly, when the data enable signal DATA_EN is activated, the latch section 1331 may be configured to latch the data signal DATA.

The selection section 1332 is configured to receive the output signal of the latch section 1331 and the data signal DATA. The selection section 1332 may selectively output the output signal of the latch section 1331 or the data signal DATA based on a selection signal SEL.

The selection signal SEL may include a general test mode signal TM. In the alternative, the selection signal SEL may include a signal generated from the signal generation section 1333.

The signal generation section 1333 may generate the selection signal SEL according to a result obtained by comparing a preset time SET_time with the tRTW. For instance, when the tRTW is longer than the preset time SET_time, the signal generation section 1333 may be configured such that the selection section 1332 directly outputs the data signal DATA. However, when the tRTW is shorter than the preset time SET_time, the signal generation section 1333 may be configured such that the selection section 1332 outputs a latched data signal, or, the output signal of the latch section 1331.

The buffer section 1334 may include a first buffer part 1334a that amplifies and outputs data (the output signal of the selection section 1332) selected by the selection section 1332. The buffer section 1334 may also include a second buffer part 1334b that amplifies and outputs data DATA directly input from the input/output unit 131 or the substrate connection unit 132.

Figure 3:
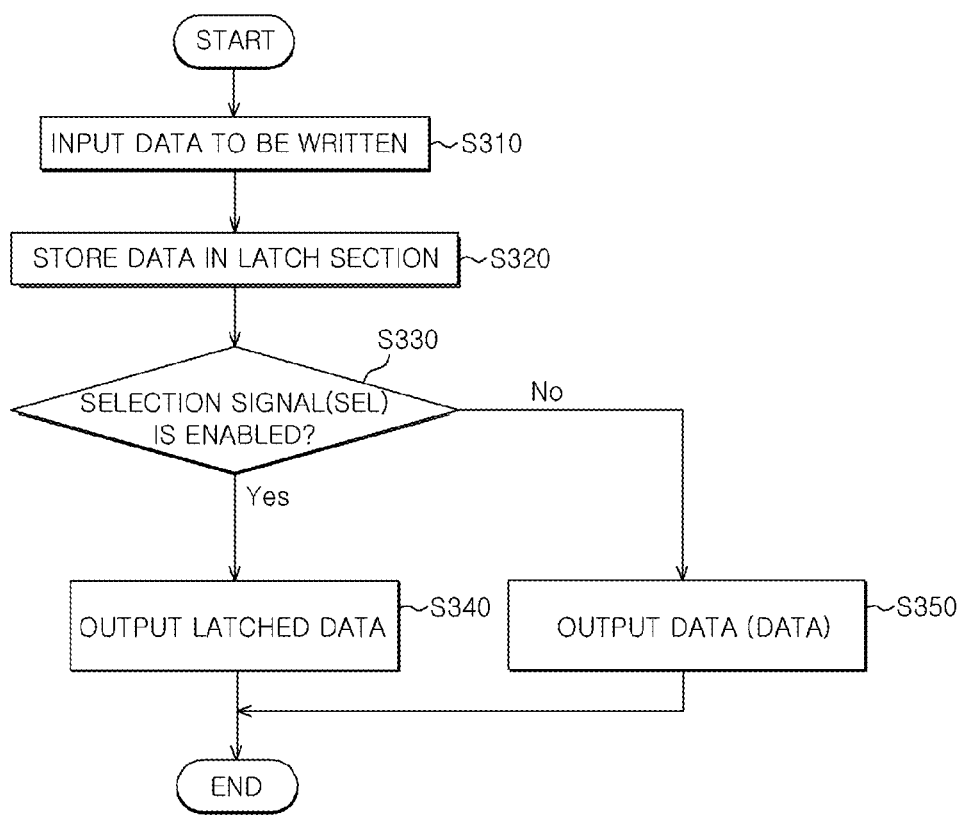
FIG. 3 is a flowchart for explaining a control method of a stacked semiconductor package according to an embodiment.

Hereinafter, a control method of the stacked semiconductor package having the aforementioned configuration according to an embodiment will be described with reference to FIG. 1 to FIG. 3.

The interposer 130 receives data to be written in the plurality of semiconductor chips 120 from the package substrate 110 (S310). The interposer 130 also stores the input data in the latch section 1331 (S320).

Then, the selection section 1332 may output data stored in advance in the latch section 1331 (S340) or directly output data DATA transferred through the input/output pad (S350) according to whether a selection signal is enabled (S330).

Figure 4:
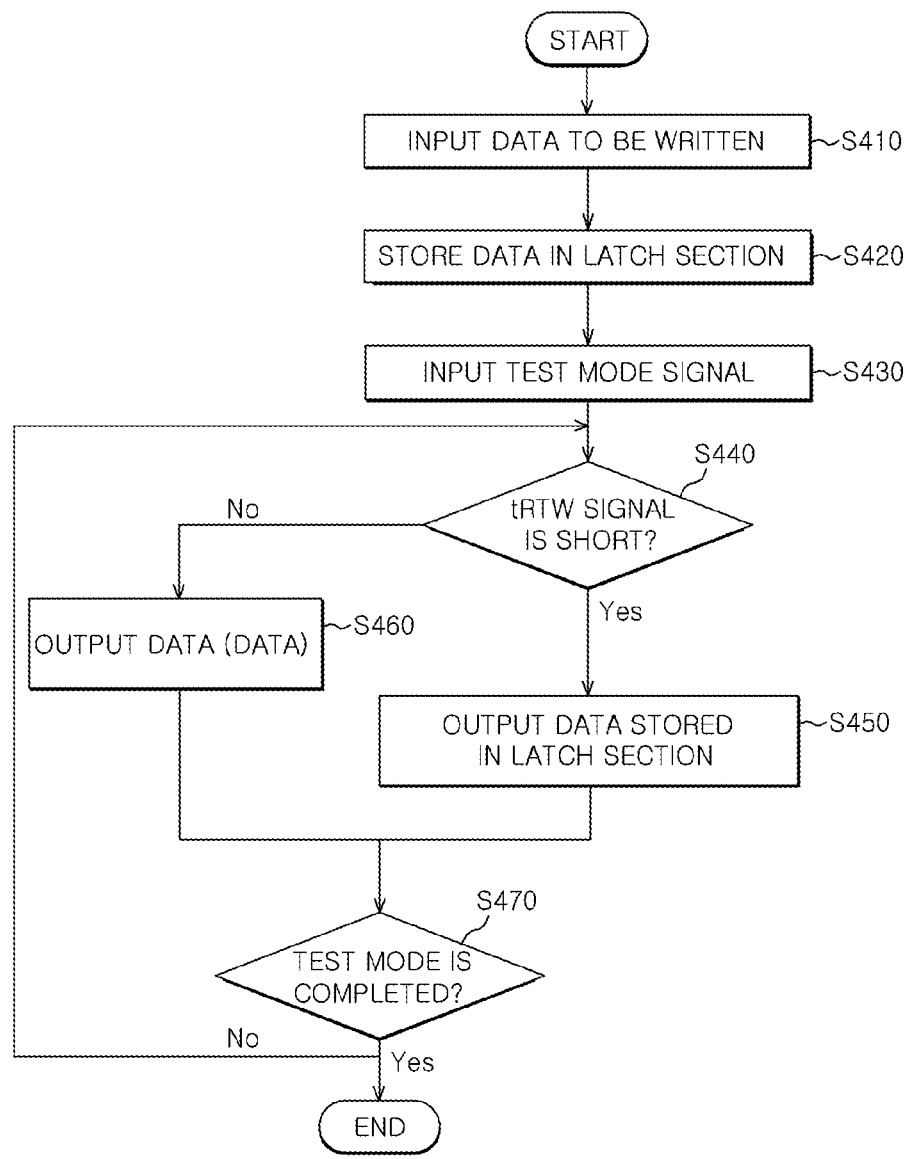
FIG. 4 is a flowchart for explaining a control method of a stacked semiconductor package according to an embodiment.

Hereinafter, a control method of the stacked semiconductor package having the aforementioned configuration according to an embodiment will be described with reference to FIG. 1, FIG. 2, and FIG. 4.

The interposer 130 receives data to be written in the plurality of semiconductor chips 120 from the package substrate 110 (S410). Further, the interposer 130 stores the input data in the latch section 1331 (S420).

Then, the signal generation section 1333 receives a test mode signal (S430). The signal generation section 1333 also determines whether a signal of the tRTW is short (S440). The fact that the signal generation section 1333 determines whether the signal of the tRTW is short may be understood through a process of comparing the tRTW with a preset time.

For instance, when the signal of the tRTW is shorter than the preset time, the signal generation section 1333 determines that the signal of the tRTW is short. In addition, when the signal of the tRTW is equal to or more than the preset time, the signal generation section 1333 determines that the signal of the tRTW is not short. The preset time may be a minimum time for which read data and write data do not meet each other.

Then, when it is determined that the signal of the tRTW is short, the signal generation section 1333 generates a first signal and allows the selection section 1332 to output the data stored in advance in the latch section 1331 (S450). However, when it is determined that the signal of the tRTW is not short, the signal generation section 1333 generates a second signal and allows the selection section 1332 to output data input through the substrate connection unit 132 electrically coupled to the package substrate 110 (S460).

Then, it is determined whether the test mode has been completed (S470). When it is determined that the test mode has been completed, the test process is ended. Further, when it is determined that the test mode has not been completed, it is determined whether the signal of the tRTW is short again (S440).

As described above, the stacked semiconductor package according to an embodiment provides the interposer 130 that stores in advance data to be written in the latch section 1331. The interposer 130 also outputs the data stored in advance in the latch section 1331 or selects and outputs data input through the substrate connection unit 132 or the input/output unit 131 according to the tRTW when the test mode signal is input. As a result, it is possible to minimize loading that may occur in a test and to solve a delay problem.

While certain embodiments have been described above, it will be understood to those skilled in the art that the embodiments described are by way of example only. Accordingly, the stacked semiconductor package described should not be limited based on the described embodiments. Rather, the stacked semiconductor package described should only be limited in light of the claims that follow when taken in conjunction with the above description and accompanying drawings.

What is claimed is:

1. A stacked semiconductor package comprising:
   a package substrate;
   an interposer having a first surface and a second surface, mounted on the package substrate, wherein the first surface of the interposer is faced to the package substrate;
   a plurality of semiconductor chips stacked on the second surface of the interposer; and
   a control unit embedded in the interposer, that stores in advance data to be written in the plurality of semiconductor chips, and outputs the data stored in advance according to a test mode signal,
   wherein the interposer includes a first connection unit formed at the first surface for electrically connecting the package substrate and an input/output unit formed at the second surface for electrically connecting the plurality of semiconductor chips, and the control unit is connected between the first connection unit and the input/output unit.

2. The stacked semiconductor package according to claim 1, wherein the control unit is configured to output the data stored in advance when the test mode signal is enabled, and to output data input from the package substrate or the plurality of semiconductor chips when the test mode signal is not enabled.

3. The stacked semiconductor package according to claim 1, wherein, when the test mode signal is enabled, the control unit is configured to selectively output the data stored in advance according to a minimum time tRTW for which write data is applied after a read operation.

4. The stacked semiconductor package according to claim 3, wherein the control unit outputs the data stored in advance when the minimum time tRTW, for which write data is applied after a read operation, is shorter than a preset time.

5. The stacked semiconductor package according to claim 3, wherein the control unit outputs data input from the plurality of semiconductor chips or the package substrate, when the minimum time tRTW, for which write data is applied after a read operation, is equal to or more than a preset time.

6. A stacked semiconductor package comprising:
    a package substrate;
    an interposer mounted on the package substrate, wherein the interposer includes a first surface having a first connection unit and a second surface having an input/output unit; and
    a plurality of semiconductor chips stacked on the second surface of the interposer,
    wherein the interposer comprises:
    a control unit embedded in the interposer, that stores in advance data to be written in the plurality of semiconductor chips, and outputs the data stored in advance according to a test mode signal;
    a latch section that stores in advance data to be written through the first connection unit; and
    a selection section that is electrically coupled to the latch section and that selects and outputs the data stored in the latch section when a test mode signal is input through the input/output unit.

7. The stacked semiconductor package according to claim 6, wherein the data stored in advance in the latch section is stored before the test mode signal is input.

8. The stacked semiconductor package according to claim 7, wherein, when the test mode signal is not input, the selection section selects and outputs data input from the package substrate or the plurality of semiconductor chips.

9. The stacked semiconductor package according to claim 7, wherein the selection section outputs the data stored in the latch section when a minimum time tRTW, for which write data is applied after a read operation, is shorter than a preset time.

10. The stacked semiconductor package according to claim 9, wherein the selection section outputs data input from the package substrate or the plurality of semiconductor chips when the minimum time tRTW, for which write data is applied after a read operation, is equal to or more than the preset time.

11. The stacked semiconductor package according to claim 10, wherein the interposer further comprises:
    a signal generation section that generates a signal,
    wherein the signal generation section determines whether the minimum time tRTW, for which write data is applied after a read operation, is shorter than the preset time when the test mode signal is input, and generates a signal to allow the selection section to select output of the data stored in the latch section or to select output of the data input from the package substrate or the plurality of semiconductor chips according to a result of the determination.

* * * * *